United States Patent [19]
Namaki et al.

[11] Patent Number: 5,204,542

[45] Date of Patent: * Apr. 20, 1993

[54] NONVOLATILE SEMICONDUCTOR MEMORY DEVICE OF SHARED CONTACT SCHEME NOT HAVING INCLINED WIRING

[75] Inventors: Satoru Namaki; Shooji Kitazawa; Teruhiro Harada, all of Tokyo, Japan

[73] Assignee: Oki Electric Industry Co., Ltd., Tokyo, Japan

[*] Notice: The portion of the term of this patent subsequent to Jun. 19, 2007 has been disclaimed.

[21] Appl. No.: 784,632

[22] Filed: Oct. 25, 1991

Related U.S. Application Data

[63] Continuation of Ser. No. 540,285, Jun. 18, 1990, abandoned, which is a continuation of Ser. No. 295,260, Jan. 9, 1989, Pat. No. 4,935,791.

[30] Foreign Application Priority Data

Jan. 12, 1988 [JP] Japan ................................. 63-3111

[51] Int. Cl.$^5$ ............................................ H01L 29/68
[52] U.S. Cl. ..................................... 257/315; 257/390; 257/401
[58] Field of Search ........................... 357/23.5, 45, 54

[56] References Cited

U.S. PATENT DOCUMENTS

| | | | |
|---|---|---|---|
| 4,282,446 | 8/1981 | McElroy | 357/23.5 |
| 4,377,818 | 3/1983 | Kuo et al. | 357/23.5 |
| 4,467,453 | 8/1984 | Chiu et al. | 357/23.5 |
| 4,707,718 | 11/1987 | Sakai et al. | 357/45 |
| 4,870,470 | 9/1989 | Bass, Jr. et al. | 357/23.5 |
| 4,935,791 | 6/1990 | Namaki et al. | 357/23.5 |
| 4,949,305 | 8/1990 | Toyama et al. | 357/23.5 |
| 5,023,681 | 6/1991 | Ha | 357/23.5 |

Primary Examiner—Andrew J. James
Assistant Examiner—Courtney A. Bowers
Attorney, Agent, or Firm—Edward D. Manzo; John J. King

[57] ABSTRACT

A read-only semiconductor memory device including memory elements arranged in a principal surface of the semiconductor substrate in a matrix to form MOS transistors. Each of the memory elements has first and second electrode regions formed in the principal surface so as to respectively constitute the first and second electrodes, insulative layers formed on the principal surface, and a control electrode layer formed via the insulative layers on the principal surface to constitute the control electrode. The control electrode layer is commonly connected to memory elements in the lateral direction of the matrix. The first and second electrode regions are respectively arranged such that any adjacent two in the vertical direction of the memory elements electrically share the first and second electrodes, respectively. Each of the first electrode regions is interconnected to the first electrode region of one of the elements adjacent thereto in the lateral direction. The second electrode regions are also interconnected similarly. The device further includes first and second conductor members each formed on the insulative layers so as to electrically interconnect the first and second electrode regions, respectively, of the elements in the vertical direction. The boundaries between the control electrode layer and the first and second electrodes are defined in the lateral direction substantantially in parallel thereto.

14 Claims, 6 Drawing Sheets

NONVOLATILE SEMICONDUCTOR MEMORY DEVICE OF SHARED CONTACT SCHEME NOT HAVING INCLINED WIRING

This is a continuation of application Ser. No. 540,285, filed Jun. 18, 1990, now abandoned, which is a continuation of application Ser. No. 07/295,260, filed Jan. 9, 1989, now U.S. Pat. No. 4,935,791.

BACKGROUND OF THE INVENTION

1. Field of the Invention

The present invention relates to a semiconductor memory device, and in particular, to a memory device of an electrically programmable read-only memory (EPROM) including a nonvolatile semiconductor memory element.

2. Description of the Prior Art

There have been disclosed nonvolatile semiconductor memory devices such as one employing as memory cells nonvolatile semiconductor memory elements each having a floating gate, for example, in the Japanese Patent Laid-Open Publication No. 154692/1984 and the Japanese Patent Publication No. 38675/1984.

The memory element described in the first article is identical in the configuration thereof to one schematically shown in FIGS. 7A and 7B. That is, these elements have the planar pattern shown in FIG. 7A and a cross sectional form shown in FIG. 7B and taken along VIIB—VIIB of FIG. 7A. As shown in those figures, the memory element is configured such that, for example, a source region 2 and a drain region 3 each of an n+-type region are formed on a surface area of a p-type substrate 1. A floating gate 6 is disposed via an insulation layer 5 over a channel region 4 between the source and drain regions 2 and 3, and a control gate 7 is formed thereover via the insulation layer 5. In the memory element having such a structure, electrons are injected into the floating gate 6 so as to increase a threshold voltage as a metal-oxide-semiconductor, MOS, transistor, thereby electrically writing data therein.

FIG. 8 shows a planar pattern of a memory element array in which memory elements each having the configurations shown in FIGS. 7A and 7B are integrally arranged along vertical and horizontal directions in a matrix form. In this structure, a plurality of rows 17-1, 17-2, etc. are formed so as to extend in parallel to each other along a vertical direction. These row lines or strips 17 are wirings associaed with the control gates 7 and are formed with polycrystalline silicon layers disposed as second layers relative to the substrate 1. Beneath the row lines 17, there are formed floating gates 16-1, 16-2, etc. of polycrystalline silicon layers disposed as first layers. In addition, sandwiched by the respective floating gates 16, there are formed n+-type diffusion layers 12-1, 12-2, etc. as source regions 2 of the respective memory elements 15, and n+-type diffusion layers 12-1, 13-2, etc. as drain regions 3 thereof. In this structure, the n+-type diffusion layer 12 is disposed for each two rows. The n+-type diffusion layer 13 is formed for a pair of adjacent memory cells 15 so as to be connected to wirings 18-1, 18-2, etc. disposed as columns extending along a transverse direction in parallel to each other. Incidentally, the memory cell elements 15-1, 1-2, etc. are respectively arranged at intersections between the rows 17 and column wirings 18. In the memory element array, wirings 19-1, etc. are formed to be parallel to the wirings 18 as columns in a regular arrangement, for example, each for eight columns, so as to be connected to the n+-type diffusion layer 12.

FIG. 9 shows an equivalent circuit of the memory element array of FIG. 8. The reference numerals in FIG. 9 correspond to those indicated in FIG. 8. In this structure, n+-type diffusion layers 12 as common source wirings of the memory elements 15 develop a resistance of about several tens ohms per square micrometer, $\mu m^2$ and is hence indicated with a resistor symbol in FIG. 9.

In a case where a programming operation of data is carried out on the memory elements 15, the source wiring 19 common to the memory elements 15 are set to a ground level and a high voltage is applied to one of the rows and to one of the columns. That is, the high voltage is applied across the gate and the source as well as the drain and the source of a memory element 15 located at an intersection between the row and the column to which the high voltage is applied, which causes an avalanche effect in the proximity of the drain 3 of the memory cell 15 such that hot electrons thus produced are injected into the floating gate 6 so as to change the threshold voltage of the memory element 15 as the MOS transistor. In the programming operation, the programming current passing through the memory element 15 reaches several milliamperes. In this situation, if the n+-type diffusion layers 12 are associated with a high parasitic resistance, the source potential of the memory element 15 to be programmed by the program current is increased, which leads to a difficulty of the programming operation. To avoid this disadvantage, it is commonly employed that the wiring 18 is disposed each for a plurality of columns, each for eight columns in this particular instance.

Moreover, in Dennis R. Wilson et al. "A 100 ns 150 mW 64 bit ROM" ISSCC 1978, pp. 152–153 and 273, there is proposed a memory arrangement method called shared contact of which a planar pattern is shown in FIG. 10. The longitudinal structure of the memory element is the same as that of the memory element of FIG. 7B. Columns 28-1, 28-2, etc. are wirings to be connected to n+-type diffusion layers 23-1, 23-2, etc. forming drains 3 of the respective memory elements 25-1, 25-2, etc. whereas columns 29-1 etc. are wirings to be linked with n+-type diffusion layers 22-1, 22-2, etc. configuring sources 2 of the memory elements 25 such that the columns 28 and 29 are alternately arranged in a vertical direction so as to extend in the transversal direction. The memory elements 25 are arranged such that the direction of the channel width thereof is inclined by 45 degrees with respect to the columns. That is, in this figure, the starting point, ending point and intersection of lines constituting a letter "X" are n+-type diffusion layers of the drain 3 or the source 2 of the memory elements 25, and these n+-type diffusion layers are linked with the columns 28 or 29. Rows 27-1, 27-2, etc. are formed to extend in parallel with each other in the vertical direction. These rows 27 are wirings associated with the control gate 7.

FIG. 11 shows equivalent circuits of the memory elements of FIG. 10. The reference numerals used in FIG. 11 are assigned in association with those of FIG. 10.

In an operation to program a particular memory element 25, as described in the Japanese patent publication No. 38675/1984, all columns 29 linked with the sources 2 of the memory elements 25 are beforehand pulled up via a high-resistance load to a potential of the power supply Vcc such that one of the columns 29 is lowered to the ground level. A high voltage is then applied to either one of two columns 28 adjacent to the column at the ground level. In this situation, by setting one of the rows 27 to a high voltage, the programming operation is achieved on a memory element 25 to which a high voltage is applied across the gate and the source as well as the drain and the source thereof like in the case of the programming of the memory element 15 shown in FIG. 9.

However, in the conventional device of the configuration shown in FIG. 8, a considerable amount of parasitic resistance is developed through the n+-type diffusion layer as the source regions of the memory elements; and in order to reduce the resistance, it is necessary to dispose columns of the source regions of the memory elements in the memory element array. In addition, when a thiner line is employed for the elements, the resistance of the n+-type diffusion layer becomes higher and hence the ratio of the source columns in the memory elements greatly increases: in consequnce, there arises a problem that the chip area becomes greater.

On the other hand, in this regard, according to the device of the prior art having the configuration of FIG. 10, it is possible to decrease the chip area at least by ten percent. In consequence, the device may be designed in a submicron order. According to the design rule in the submicron area, an electron beam exposure apparatus is required to be adopted to form a pattern. However, in the operation data of the exposure apparatus, there does not exist any data associated with an exact 45-degree scanning operation. For example, when an attempt is made to scan a 45-degree line, a step-wise line is assumed for the 45-degree line, and hence there appears a problem that the finishing precision is lowered in the memory elements located along an inclined line in the device of the constitution of FIG. 10.

SUMMARY OF THE INVENTION

It is therefore an object of the present invention to provide a nonvolatile semiconductor memory device of an improved shared contact which removes the problems that the chip area became greater due to an increase of the number of source columns of the memory elements and that the finishing precision of the memory device was lowered.

According to the present invention, there is provided a read-only semiconductor memory device comprising a semiconductor substrate, and a plurality of memory elements arranged in a principal surface of said semiconductor substrate in a matrix to form MOS transistors each having a first electrode, a second electrode and a control electrode controlling a channel formed between the first and second electrodes, said plurality of memory elements each comprising first and second electrode regions respectively formed in said principal surface so as to respectively constitute the first and second electrodes, insulative layers formed on the principal surface: and a control electrode layer formed via said insulative layers on said principal surface to constitute the control electrode, said control electrode layer being commonly connected to said plurality of memory elements in a first direction of the matrix, said first electrode regions being arranged such that any adjacent two in a second direction, substantially perpendicular to the first direction, of said plurality of memory elements electrically share the first electrodes, each of said first electrode regions being interconnected to the first electrode region of one of said plurality of memory elements adjacent thereto in the first direction of the matrix, said second electrode regions being arranged such that any two in the second direction of said plurality of memory elements electrically share the second electrode, each of said second electrode regions being interconnected to the second electrode region of one of said plurality of memory elements adjacent thereto in the first direction of the matrix, said device further comprising a plurality of first conductor members each formed on said insulative layers so as to electrically interconnect said first electode regions of ones of said plurality of memory elements in the second direction of the matrix, and a plurality of second conductor members each formed on said insulative layers so as to electrically interconnect said second electode regions of ones of said plurality of memory elements in the second direction of the matrix, boundaries between said control electrode layer and said first and second electrodes being defined in the first direction substantially in parallel thereto.

According to the present invention, since the nonvolatile semiconductor memory device is configured in the shared contact scheme, it is possible to remove the source columns in the memory element array, and hence there exists little area of the source columns in the memory elements in association with a reduction of the line width employed in the device, which prevents the chip area from being increased. Moreover, in this device constitution, each memory element includes regions formed through a patterning operation without establishing the 45-degree wiring: consequently, even when an electron beam exposure apparatus is employed, the finishing precision of the memory device is not lowered.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
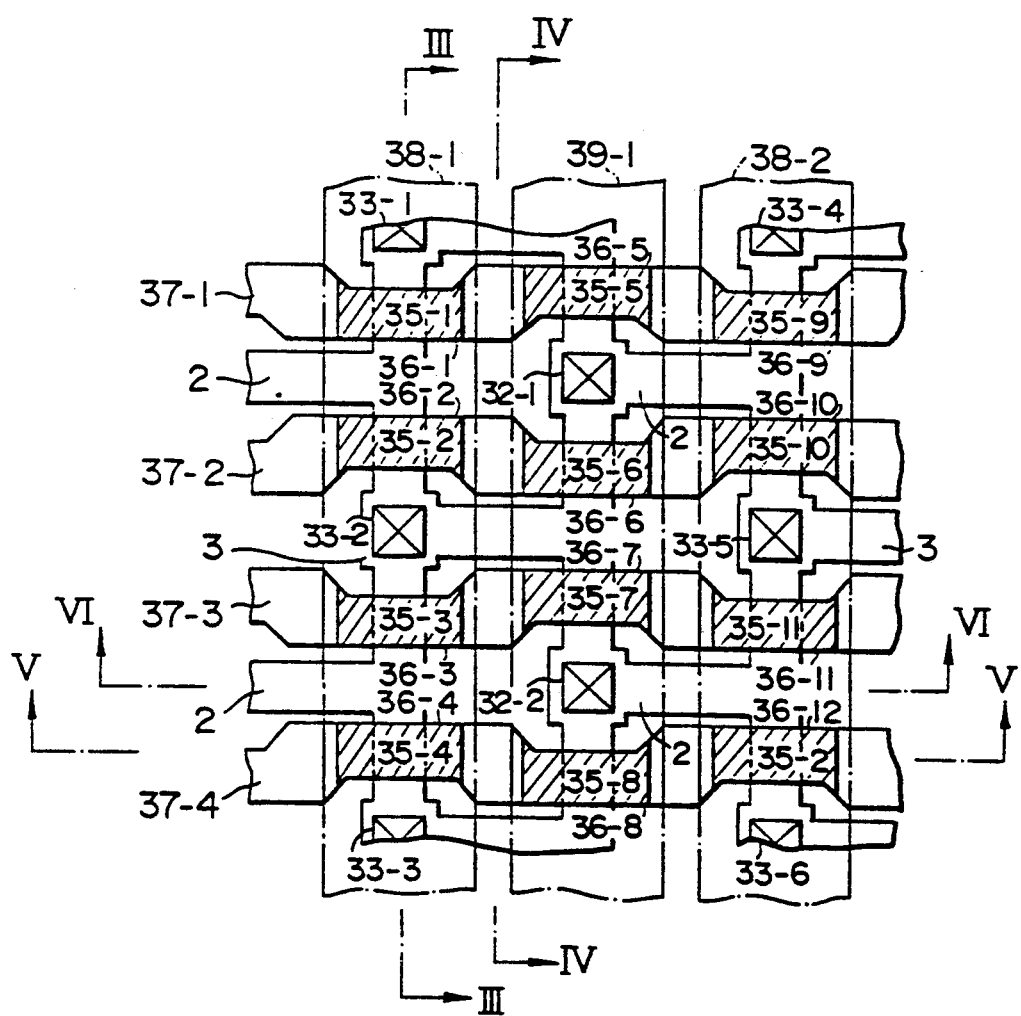
FIG. 1 shows a planar pattern in an embodiment of a nonvolatile semiconductor memory device according to the present invention.
Figure 3:
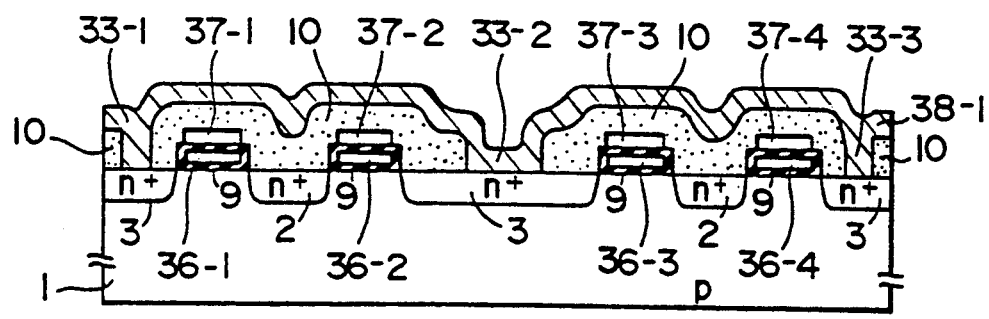
FIGS. 3 through 6 are cross-sectional views of the memory device of FIG. 1 taken along dot-and-dash lines III—III, IV-VI, V—V and VI—VI.
Figure 7A:
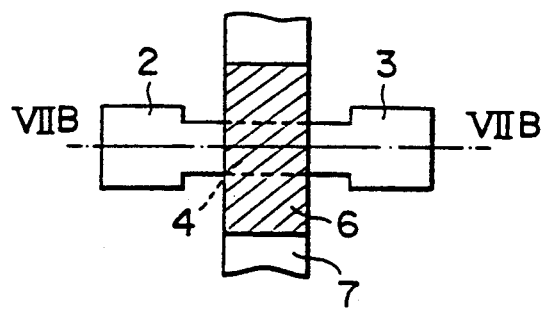
FIGS. 7A and 7B are a planar pattern and a cross-sectional view of a memory element constituting the memory device of FIG. 1.
Figure 7B:
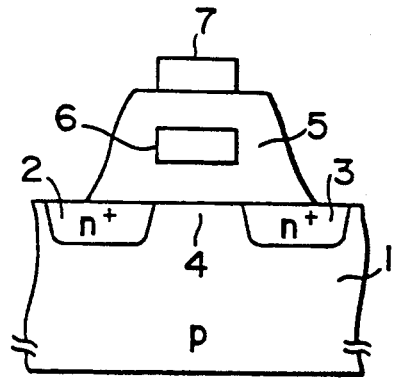
Figure 8:
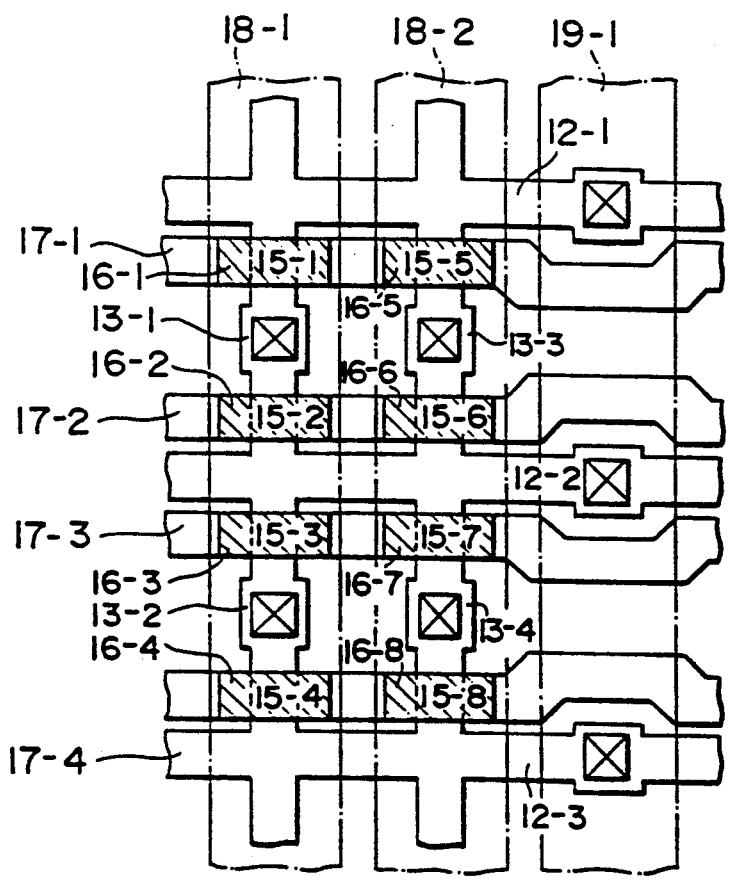
FIGS. 8 and 10 are planar pattern views, similar to the pattern of FIG. 1, showing a conventional nonvolatile semiconductor memory device.
Figure 9:
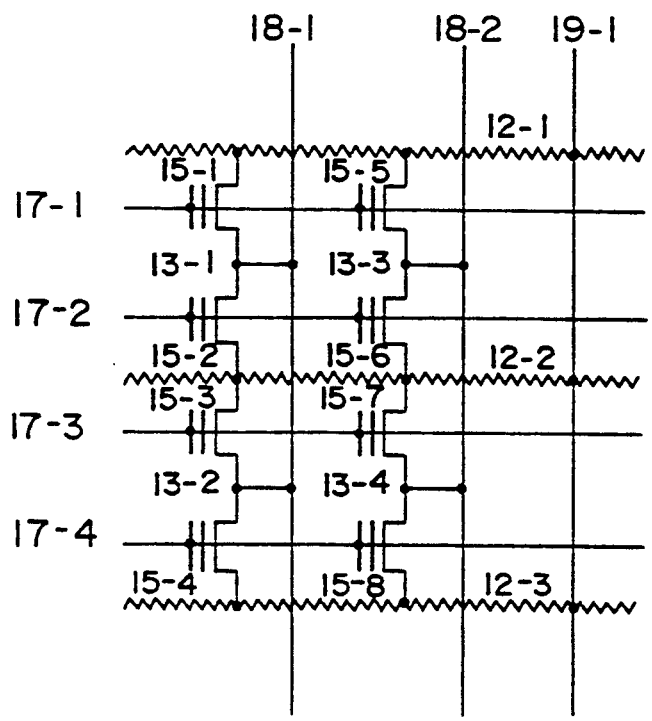
FIGS. 9 and 11 are circuit diagrams, similar to the circuit of FIG. 2, showing equivalent circuits of the devices of FIGS. 8 and 10, respectively.
Figure 10:
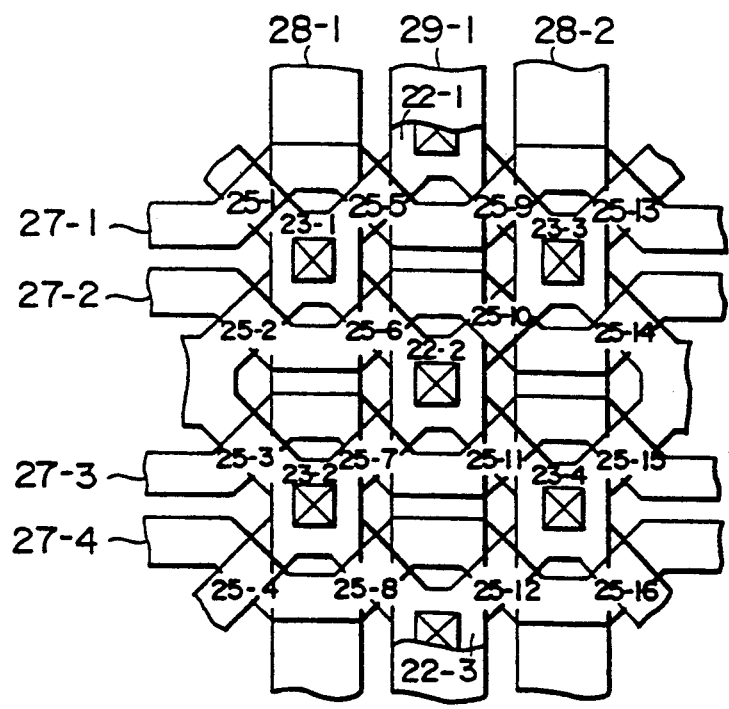

FIG. 1 is a schematic plan view showing a memory matrix as an embodiment of the nonvolatile storage device according to the present invention. The embodiment is advantageously directed to an n-channel EPROM. The present invention is, however, advantageously applicable not only to EPROM but also to any type of ROMs, such as mask ROM. A vertical cross-sectional view of either one of the memory elements 35-1, 35-2, etc. is shown in FIG. 7B. A plurality of rows 37-1, 37-2, etc. are formed so as to extend in parallel to each other in the horizontal direction. Those rows 37 are wirings associated with the control gate 7. FIG. 7B, and are constituted with a polycrystalline silicon layer disposed as the second layer relative to a p-type substrate 1. Below the rows 37, there are disposed floating gates 36-1, 36-2, etc, disposed in the form of a polycrystalline silicon layer as the first layer relative to the substrate 1. This layer corresponds to the gate layer 6 in a single element. The vertical cross-sectional structures of those layers 37 and 36 can be clearly seen in FIG. 3 showing the cross-section taken along the dot-and-dash line III—III of FIG. 1. In addition, sandwiched by floating gates 36, there are disposed n+-type diffusion layers 32-1, 32-2, etc. as source regions 2 of the respective memory elements 35 and n+-type diffusion layers 33-1, 33-2, etc. as drain regions 3 thereof. In FIG. 1, the n+-type diffusion layers 32 and 33 respectively functioning as the source and drain regions 2 and 3 of vertically adjacent memory elements 35 are respectively formed in an integral fashion. In consequence, the plurality of memory elements 35 are arranged in a direct line in the vertical direction in the figure.

Columns 38-1, 38-2, etc. are wirings to be connected to the n+-type diffusion layers 33 forming the drains 3 of the memory elements 35. Columns 39-1, 39-2, etc. are wirings to be linked to the n+-type diffusion layers 32 constituting the sources 2 thereof. These columns 38 and 39 are alternately arranged in the horizontal direction of this figure so as to extend over the memory elements 35 to cover the planar area thereof, thereby orthogonally crossing the rows 37. This structure is shown in the cross-sectional view of FIG. 5 taken along the dot-and-dash line V—V of FIG. 1. The n+-type diffusion layer 33 functioning as drain regions 3 of the memory elements 35 and connected to the wirings 38, and the n+-type diffusion layer 32 functioning as source regions 2 thereof and connected to the wirings 39 are extended for connections by means of connecting points thereof, respectively, up to the n+-type diffusion layer 33 functioning as the drain region 3 of the adjacent memory elements 35 and the n+-type diffusion layer 32 operative as source regions 2 thereof toward the right or left direction in FIG. 1.

Figure 4:
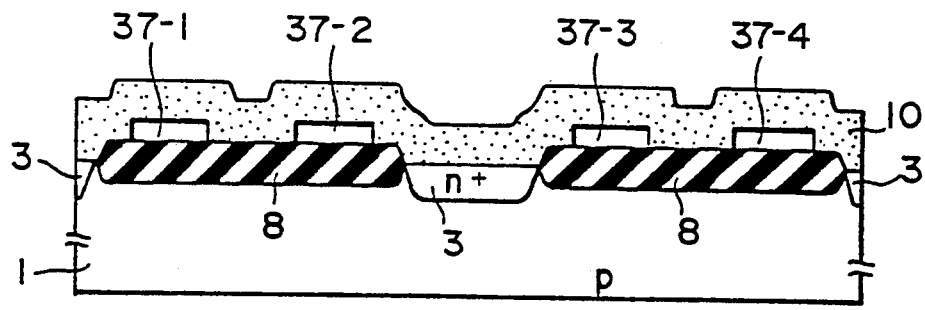
Figure 5:
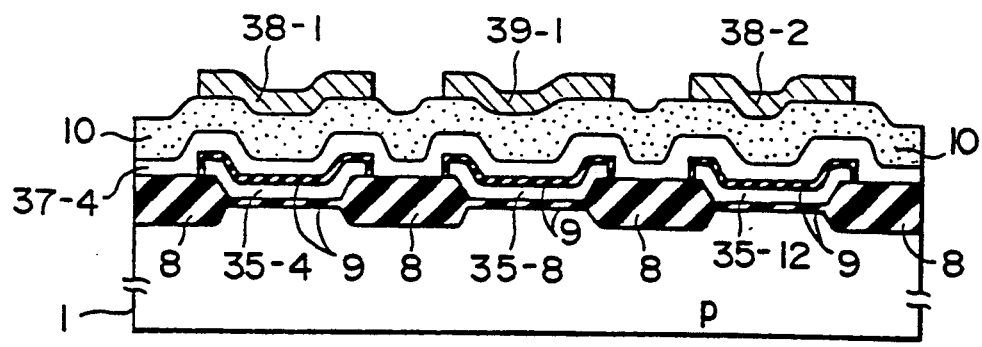
Figure 6:
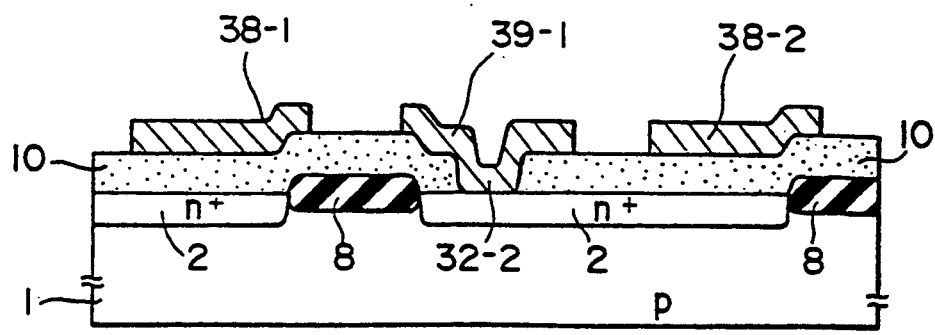

As can be seen from FIGS. 4, 5, and 6, the respective memory elements 35 are separated from each other by use of a field oxide layer 8 of $SiO_2$ formed through a selective oxidation (LOCOS). In addition, the floating gate 36 is enclosed with a gate oxide layer 9 of $SiO_2$. Over this structure, an intermediate insulation layer 10 of PSG or BPSG is disposed so as to form thereover columns 38 and 39 of aluminum for example.

Figure 2:
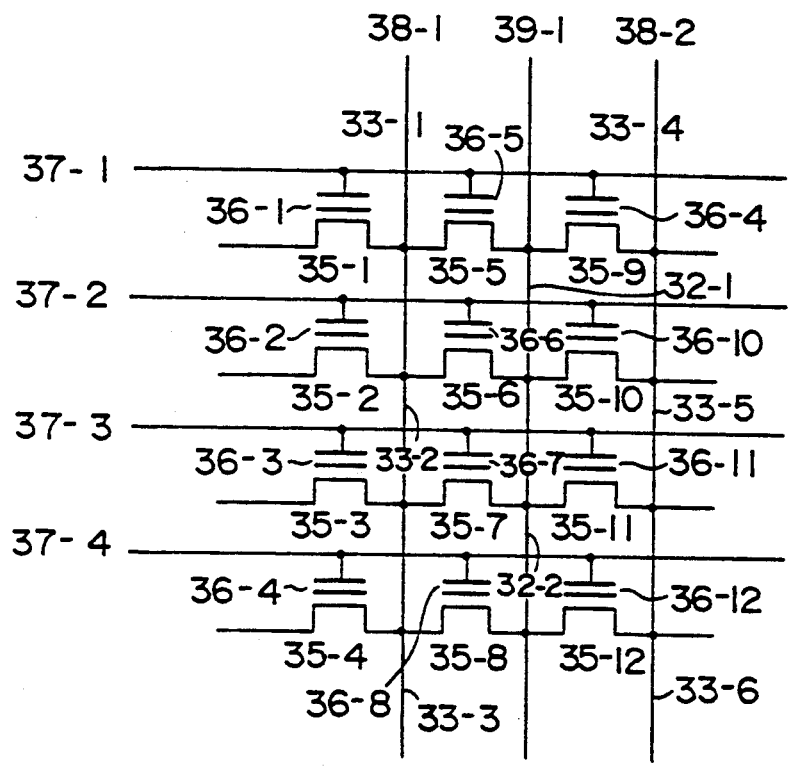
FIG. 2 is a schematic diagram showing an equivalent circuit of the memory device of FIG. 1.
Figure 11:
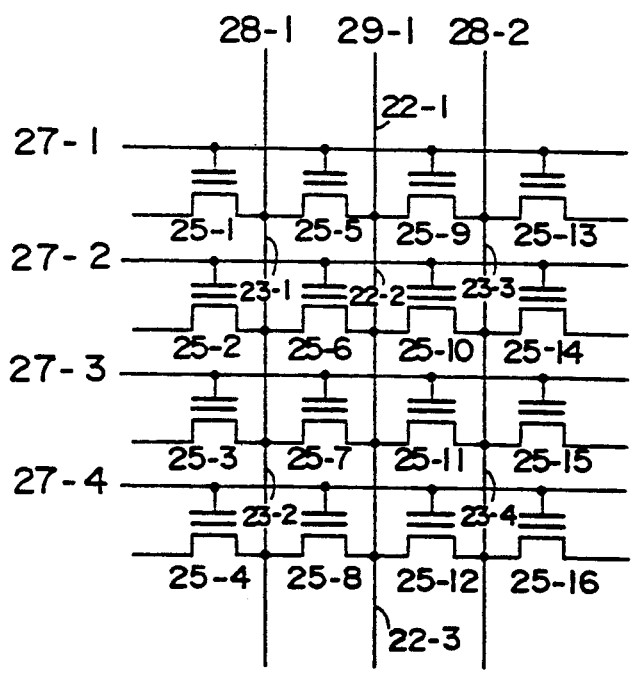

FIG. 2 shows an equivalent circuit of the device of FIG. 1. This circuit is electrically of the same constitution as that of FIG. 11, namely, is configured in the shared contact scheme. The row 37 is herein called a word line in a semiconductor memory device, whereas the columns 38 and 39 formed with aluminum layers, for example, are called bit lines.

In a case where a particular memory element 35 is to be programmed, all columns 39 connected to the source 2 of the memory element 35 are beforehand pulled up via a high-resistance load to a potential Vcc of the power supply, and then one of the columns 39 is selectively set to a lower potential, the ground level, for example. Thereafter, a high voltage is applied to either one of two columns 38 adjacent to the column at the ground level. In this situation, by setting one of the plurality of rows 37, the programming operation is achieved on a memory element 35 to which a high voltage is applied across the gate and the source as well as the drain and the source thereof.

As described above in the embodiment, in the semiconductor memory device according to the present invention, the respective electrodes of all memory transistor cells are arranged in parallel to each other in a direction such that the memory cell transistors are located beneath the aluminum rows, and as shown in FIGS. 1 to 6, there is not employed the 45-degree inclined pattern at least in the regions where the memory elements are formed: consequently, the element forming precision and the yield are improved: furthermore, a higher integration can be attained as compared with the conventional device.

As described above, according to the present invention, the memory element array of the semiconductor memory device of the shared contact is configured without adopting the inclined pattern, when compared with the conventional device associated with the same process and the same design rule, the area occupied by the memory elements can be reduced at least by ten percent. This effect increases when the thinner design rule is employed and hence greatly contributes to the higher integration of the device. In addition, there can be avoided the deterioration of the finishing precision of the memory device which was a problem of the conventional memory element array of the shared contact configured with an area similar to that of the device of the present invention, which enables a semiconductor memory device having a higher efficiency.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A read-only semiconductor memory device comprising:
   a semiconductor substrate;
   a plurality of memory elements arranged in a principal surface of said semiconductor substrate in a matrix to form MOS transistors each having a first electrode, a second electrode and a control electrode for controlling a channel formed between the first and second electrodes, said plurality of memory elements each comprising:
   first and second electrode regions respectively formed in said principal surface to form said first and second electrodes respectively;
   insulative layers formed on the principal surface;
   a control electrode layer formed via said insulative layers on said principal surface to form said control electrode;
   said control electrode layer being commonly interconnected over said plurality of memory elements in a first direction of the matrix;
   said device further comprising:
   a plurality of first conductor members each formed on said insulative layers to interconnect electrically said first electrode of one of said plurality of memory elements to said first electrode of another of said plurality of memory elements in a second direction, substantially perpendicular to the first direction, wherein said first electrode of one of said connected memory elements is adjacent and electrically connected to said first electrode of still another one of said memory elements in the first direction; and a plurality of second conductor members each formed on said insulative layers to interconnect electrically the second electrode of said one memory element to the second electrode of still another of said plurality of memory elements in a second direction, wherein said second electrode of one of said connected memory elements is adjacent and electrically connected to the second electrode of still another one of said memory elements in the first direction; and boundaries between said control electrode layer and said first and second electrodes being defined substantially parallel to the first direction.

2. A memory device in accordance with claim 1, wherein said first and second electrode regions extend in the first direction.

3. A memory device in accordance with claim 1, wherein each of said memory elements comprises:

an additional insulative layer formed on the principal surface and below said control electrodes; and a gate electrode layer formed via said additional insulative layer over the principal surface to form a floating gate electrode of the MOS transistor; whereby said device functions as an EPROM.

4. A memory device in accordance with claim 1, wherein said first and second electrode regions comprise respectively source and drain electrodes of the MOS transistors.

5. A memory device in accordance with claim 1, wherein said substrate comprises a p-type semiconductor material, said first and second electrode regions comprising an n-type impurity.

6. A memory device in accordance with claim 1, wherein said control electrode layers are operative as word lines of said memory device, said first and second conductor members being operative as bit lines of said device.

7. A semiconductor memory device coupled to a first and second voltage supply, comprising:

a semiconductor substrate having a major surface therein;

a first and second conductive lines, formed over said major surface, respectively, substantially extending in a first direction and separated by a distance sufficient to encompass another line extending in the same direction, said first and second conductive lines being respectively coupled to the first voltage supply;

a third conductive line, formed over said major surface and located between said first and second conductive lines, substantially extending in the first direction, said third conductive line being coupled to the second voltage supply;

a first memory cell, formed below said first conductive line, having a first diffusion region in said major surface and a first control electrode overlying said major surface;

a second memory cell, adjacent to said first memory cell and formed below said first conductive line, having a second diffusion region in said major surface and a second control electrode overlying said major surface;

a third memory cell, adjacent to said first memory cell and formed below said third conductive line, having third and fourth diffusion regions in said major surface and a third control electrode overlying said major surface between said third and fourth diffusion regions;

a fourth memory cell, adjacent to said second and third memory cells and formed below said third conductive line, having fifth and sixth diffusion regions in said major surface and a fourth control electrode overlying said major surface between said fifth and sixth diffusion regions;

a fifth memory cell, adjacent to said third memory cell, and formed below said second conductive line, having seventh and eighth diffusion regions in said major surface and a fifth control electrode overlying said major surface between said seventh and eighth diffusion regions;

a sixth memory cell, adjacent to said fourth and fifth memory cells and formed below said second conductive line, having ninth and tenth diffusion regions in said major surface and a sixth control electrode overlying said major surface between said ninth and tenth diffusion regions;

said first, second, third and fifth diffusion regions being commonly and electrically connected to said first conductive line;

said fourth and eighth diffusion regions being commonly and electrically connected to said third conductive line;

said sixth and tenth diffusion regions being commonly and electrically connected to said third conductive line;

said seventh and ninth diffusion regions being commonly and electrically connected to said second conductive line;

said first, third and fifth control electrodes, aligned in a second direction extending across the first direction, being electrically connected to one another; and said second, fourth and sixth control electrodes, aligned in the second direction extending across the first direction, being electrically connected to one another.

8. A semiconductor memory device is accordance with claim 7 wherein said control electrodes comprise polycrystalline silicon.

9. A semiconductor device in accordance with claim 7 wherein said first, second and third conductive lines comprise aluminum.

10. A semiconductor memory device in accordance with claim 7 wherein said semiconductor substrate is a p-type silicon substrate.

11. A semiconductor memory device in accordance with claim 7 further comprising;

floating gates arranged between said control electrodes and said major surface of said semiconductor substrate in a cross-sectional area of each said control electrode and said conductive line, each said floating gate being enclosed with a first insulative layer; and a second insulative layer formed on the control electrodes, said first, second and third conductive lines being formed on said second insulative layer.

12. A semiconductor memory device in accordance with claim 11 wherein said floating gate comprises polycrystalline silicon.

13. A semiconductor memory device in accordance with claim 11 wherein said first insulative layer comprises silicon dioxide.

14. A semiconductor memory device in accordance with claim 11 wherein said second insulative layer comprises phosphosilicate glass or borophosphosilicate glass.

* * * * *